US008597056B2

(12) United States Patent
Blanchfield et al.

(10) Patent No.: US 8,597,056 B2
(45) Date of Patent: Dec. 3, 2013

(54) CARD EDGE CONNECTOR (75) Inventors: Michael Allen Blanchfield, Camp Hill, PA (US); Steven Lee Flickinger, Hummelstown, PA (US); Benjamin Howard Mosser, Middletown, PA (US); Evan Charles Wickes, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 106 days.

(21) Appl. No.: 13/173,949

(22) Filed: Jun. 30, 2011

(65) Prior Publication Data
US 2013/0005190 A1 Jan. 3, 2013

(51) Int. Cl.
*H01R 24/00* (2011.01)
(52) U.S. Cl.
USPC ......................................... 439/630
(58) Field of Classification Search
USPC ............... 439/630, 235, 486, 631–632, 660
See application file for complete search history.

(56) References Cited

U.S. PATENT DOCUMENTS

| 5,024,609 | A | 6/1991 | Piorunneck | |
|---|---|---|---|---|
| 6,203,328 | B1 | 3/2001 | Ortega et al. | |
| 6,309,254 | B1 | 10/2001 | Korsunsky | |
| 6,666,695 | B1 | 12/2003 | Yeh | |
| 8,167,659 | B2 * | 5/2012 | Miller | 439/630 |
| 2009/0269986 | A1 * | 10/2009 | Satoh et al. | 439/630 |
| 2011/0104914 | A1 * | 5/2011 | Zhu | 439/83 |
| 2011/0217878 | A1 * | 9/2011 | Liu et al. | 439/630 |
| 2011/0300759 | A1 * | 12/2011 | Ngo | 439/630 |

FOREIGN PATENT DOCUMENTS

| EP | 0675573 A2 | 10/1995 |
|---|---|---|
| EP | 1058351 A2 | 12/2000 |

OTHER PUBLICATIONS

International Search Report, International Application No. PCT/US2012/043920, International Filing Date Jun. 25, 2012.

* cited by examiner

*Primary Examiner* — Jean F Duverne (57) ABSTRACT

A card edge connector is provided for mounting to a printed circuit board (PCB). The card edge connector includes a housing having a mating side, a mounting side, and a card slot that extends into the mating side. The card edge connector also includes first and second contacts held by the housing. The first and second contacts include mounting segments that extend outwardly from the mounting side of the housing. The mounting segments include mounting interfaces. The mounting segments of the first and second contacts are configured to be electrically connected to corresponding contact pads on the PCB at the mounting interfaces. The mounting interface of the first contact is offset from the mounting interface of the second contact in a direction generally away from mounting side of the housing.

20 Claims, 9 Drawing Sheets

CARD EDGE CONNECTOR

BACKGROUND OF THE INVENTION

The subject matter described and/or illustrated herein relates generally to card edge connectors.

Computers and servers use numerous types of electronic modules, such as processor and memory modules (e.g. Dynamic Random Access Memory (DRAM), Synchronous Dynamic Random Access Memory (SDRAM), or Extended Data Out Random Access Memory (EDO RAM), and the like). The memory modules are produced in a number of formats such as, for example, Single In-line Memory Modules (SIMM's), Dual In-line Memory Modules (DIMM's), Small Outline DIMM's (SODIMM's), Fully Buffered DIMM's, and the like. The electronic modules may be installed in card edge connectors that are mounted on a motherboard or other system board.

At least some card edge connectors include both power and signal contacts for establishing both electrical power and electrical signal paths between the electronic module and the motherboard or other system board. To accommodate the increasing amount of functionality provided by electronic devices, it may be desirable to increase the electrical power carrying capability of a card edge connector. For example, the power carrying capability may be increased by the number and/or size of the power contacts of the card edge connector. But, because of the ongoing trend toward smaller electronic devices, it is desired to increase the power carrying capability of a card edge connector without increasing a size of the connector. However, the signal contacts of the card edge connector need to be more densely arranged, or one or more signal contacts needs to be eliminated, to accommodate the increased number and/or size of the power contacts without increasing the size of the connector. Eliminating signal contacts is disadvantageous because the card edge connector will have a decreased signal carrying capacity. Increasing the density of the signal contacts is also not without disadvantages. For example, the increased density of the signal contacts may cause adjacent signal contacts to electrically interfere with each other within the card edge connector. Moreover, and for example, the increased density of the signal contacts of the card edge connector increases the density of contact pads on the electronic module that mates with the connector, and increases the density of the contact pads on the motherboard or other system board to which the connector mounts. The increased density of the contact pads may cause adjacent contact pads to electrically interfere with each other, and/or may cause solder bridging between adjacent contact pads that results in an electrical short.

There is a need for a card edge connector that accommodates a high density of contacts without increasing the size of the connector or degrading electrical performance.

BRIEF DESCRIPTION OF THE INVENTION

In one embodiment, a card edge connector is provided for mounting to a printed circuit board (PCB). The card edge connector includes a housing having a mating side, a mounting side, and a card slot that extends into the mating side. The card edge connector also includes first and second contacts held by the housing. The first and second contacts include mounting segments that extend outwardly from the mounting side of the housing. The mounting segments include mounting interfaces. The mounting segments of the first and second contacts are configured to be electrically connected to corresponding contact pads on the PCB at the mounting interfaces. The mounting interface of the first contact is offset from the mounting interface of the second contact in a direction generally away from mounting side of the housing.

In another embodiment, a card edge connector assembly includes a printed circuit board (PCB) having a mounting edge that includes an edge surface and a component surface that extends from the edge surface. The PCB includes first and second contact pads that extend on the component surface along the mounting edge. The first contact pad is offset from the second contact pad along the component surface of the card edge in a direction generally away from the edge surface. The assembly also includes a card edge connector, which includes a housing having a mating side, a mounting side, and a card slot that extends into the mating side. The connector is mounted to the mounting edge of the PCB along the mounting side of the housing. First and second contacts are held by the housing. The first and second contacts include mounting segments having mounting interfaces. The mounting segments of the first and second contacts are electrically connected to the first and second contact pads, respectively, of the PCB at the mounting interfaces. The mounting interface of the first contact is offset from the mounting interface of the second contact in a direction generally away from mounting side of the housing.

In another embodiment, a card edge connector is provided for mating with a printed circuit board (PCB) having a card edge. The card edge connector includes a housing having a card slot that is configured to receive the card edge of the PCB therein. The card slot extends a depth into the housing. The card slot includes a power connection segment and a signal connection segment. Signal contacts are held by the housing such that the signal contacts extend within the signal connection segment of the card slot. The signal contacts include mating segments that are arranged within a row that extends along a side of the card slot. The mating segments include mating interfaces. The signal contacts are configured to mate with the PCB at the mating interfaces. The mating interfaces of adjacent mating segments within the row are offset relative to each other along the depth of the card slot. A power contact is held by the housing such that the power contact extends within the power connection segment of the card slot. The power contact is configured to carry electrical power.

DETAILED DESCRIPTION OF THE INVENTION

Figure 1:
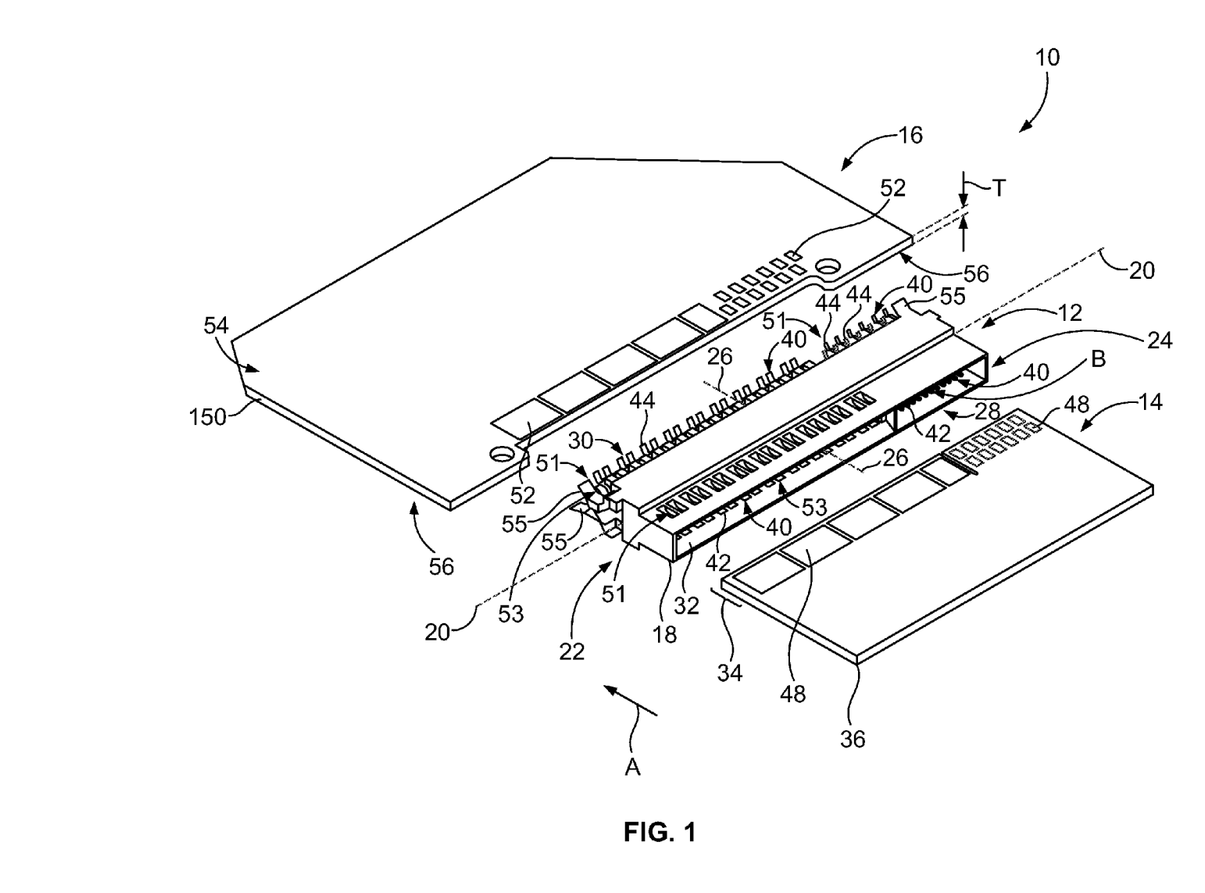
FIG. 1 is an exploded perspective view of an exemplary embodiment of a card edge connector assembly.

FIG. 1 is an exploded perspective view of an exemplary embodiment of a card edge connector assembly 10, which includes a card edge connector 12, an electronic module 14, and a printed circuit board (PCB) 16. The connector 12 includes a dielectric housing 18 that extends a length along a central longitudinal axis 20 from an end 22 to an opposite end 24. The housing 18 extends along a central axis 26 from a mating side 28 to a mounting side 30. In the exemplary embodiment, the mating side 28 extends opposite and approximately parallel to the mounting side 30. The housing 18 includes a card slot 32 that is configured to receive a card edge 34 of the electronic module 14 therein. More specifically, the electronic module 14 includes a printed circuit board (PCB) 36 that includes the card edge 34. Only the PCB 36 of the electronic module 14 is shown in FIG. 1. The card edge 34 of the PCB 36 is configured to be loaded into the card slot 32 in a loading direction A. As used herein, the term "printed circuit board" is intended to mean any electric circuit in which the electrical conductors have been printed or otherwise deposited in predetermined patterns on an electrically insulating substrate. The central axis 26 may be referred to herein as a "housing axis". A combination of the connector 12 and the PCB 16 may be referred to herein as a "card edge connector assembly".

The housing 18 holds electrical contacts 40. The electrical contacts 40 include mating segments 42 and mounting segments 44. The mating segments 42 extend into the card slot 32 and include mating interfaces 46 (FIGS. 2-4 and 6). The electrical contacts 40 are configured to mate with the PCB 36 at the mating interfaces 46. More particularly, the mating interfaces 46 engage corresponding contact pads 48 on the card edge 34 of the PCB 36 of the electronic module 14 when the electronic module 14 is mated with the connector 12. The connector 12 is configured to be mounted to the PCB 16, in electrical connection therewith, along the mounting side 30 of the housing 18. Optionally, the mounting side 30 of the housing 18 engages the PCB 16 when the connector 12 is mounted to the PCB 16. The mounting segments 44 of the electrical contacts 40 extend along the mounting side 30 of the housing 18 and include mounting interfaces 50 (FIGS. 7, 8, 10, and 11), which electrically connect to corresponding contact pads 52 on the PCB 16 to electrically connect the card edge connector 12 to the PCB 16. When the electronic module 14 is mated with the connector 12, the connector 12 electrically connects the electronic module 14 to the PCB 16. The connector 12 may include any number of the electrical contacts 40. The PCBs 16 and 36 may each include any number of the respective contact pads 48 and 52. Each of the electrical contacts 40 may be referred to herein as a "first contact", a "second contact", and/or a "third contact".

In the exemplary embodiment, the connector 12 is a straddle mount connector that is configured to be straddle-mounted to the PCB 16. The term "straddle-mounted" is intended to mean that the connector 12 includes a first set 51 of the contacts 40 having mounting interfaces 50 that electrically connect to contact pads 52 on a first side 54 of the PCB 16, and a second set 53 of the contacts 40 having mounting interfaces 50 that electrically connect to contact pads 52 on a second side 56 of the PCB 16 that is opposite the first side 54. In other words, the mounting interfaces 50 of the first and second sets 51 and 53, respectively, of electrical contacts 40 straddle the PCB 16 therebetween. The mounting interfaces 50 are electrically connected to the contact pads 52 in a surface-mount arrangement in the exemplary embodiment. Optionally, the central axis 26 of the housing 18 of the connector 12 extends within a thickness T of the PCB 16 defined between the first side 54 and the second side 56 of the PCB 16. The connector 12 optionally includes a connection element for mechanically connecting the connector 12 to the PCB 16. In the exemplary embodiment, the connector 12 includes a connection element that comprises a pair of opposing spring clips 55 that engage the PCB 16 and hold the PCB 16 therebetween. One exemplary alternative connection element is a mounting ear (not shown) having an opening for receiving a threaded or other type of fastener.

The connector 12 is not limited to being straddle-mounted on the PCB 16. Rather, in alternative to being straddle-mounted on the PCB 16, the connector 12 is vertically or right-angle mounted on the PCB 16. By "vertically mounted" it is meant that the housing 18 of the connector 12 is mounted to the first or second side 54 or 56, respectively, of the PCB 16 such that the central axis 26 extends approximately perpendicular to the side 54 or 56 to which the housing 18 is mounted. "Right-angle mounted" is intended to mean that the housing 18 of the connector 12 is mounted to the first or second side 54 or 56, respectively, of the PCB 16 such that the mating side 28 is oriented approximately perpendicular to the mounting side 30 (i.e., the central axis 26 includes an approximately 90° bend) and approximately perpendicular to the side 54 or 56 to which the housing 18 is mounted.

Figure 2:
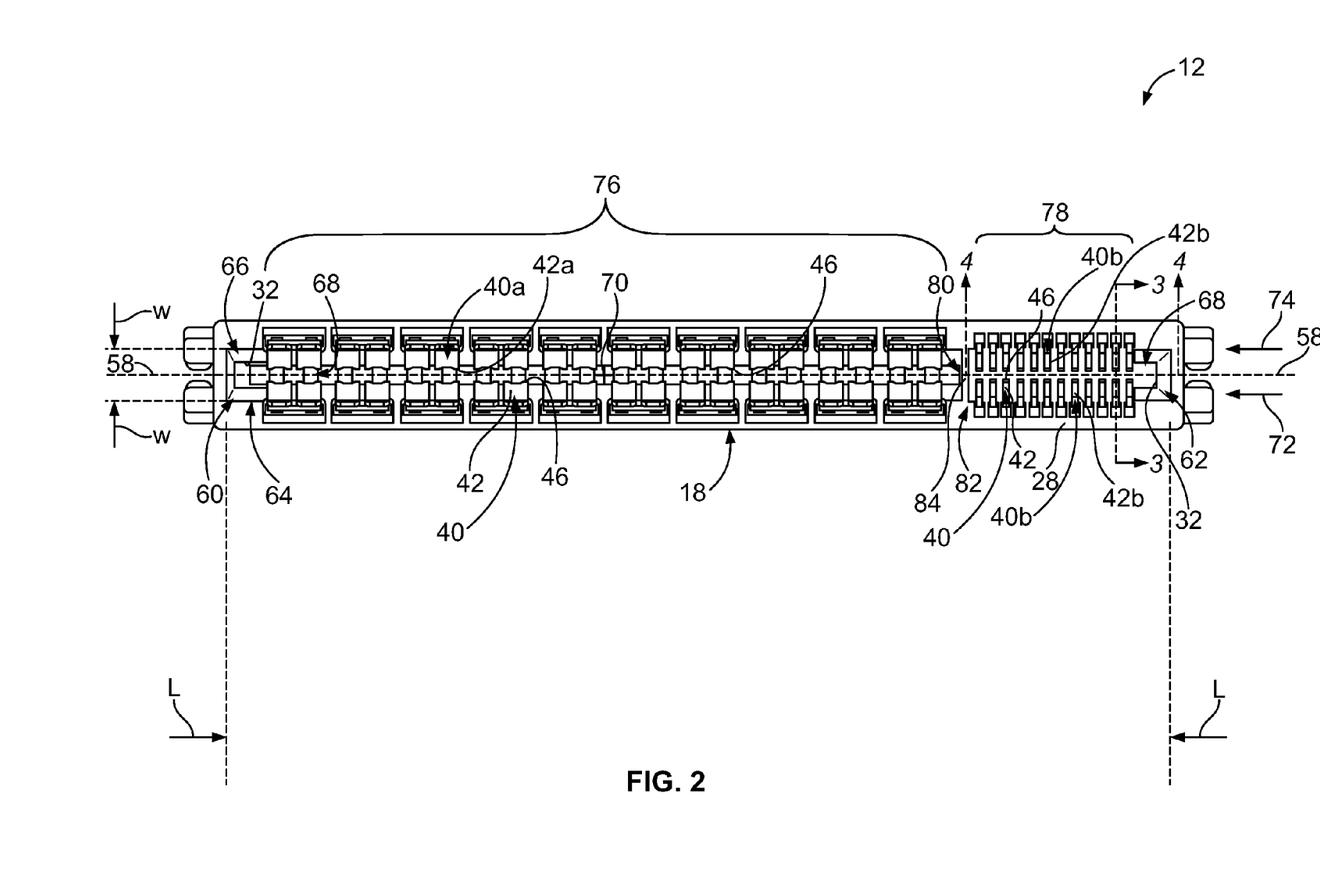
FIG. 2 is a top plan view of an exemplary embodiment of a card edge connector of the assembly shown in FIG. 1.

FIG. 2 is a top plan view of the card edge connector 12. The card slot 32 extends into the housing 18 through the mating side 28. The card slot 32 extends a length L along a central longitudinal axis 58 from an end 60 to an opposite end 62. The card slot 32 extends a width W from a side 64 to an opposite side 66. The card slot 32 is elongate such that the length L of the card slot 32 is greater than the width W of the card slot 32. The card slot 32 extends a depth D (FIGS. 3 and 4) into the housing 18 from the mating side 28 of the housing 18 to a bottom side 68 of the card slot 32. The depth D of the card slot 32 extends into the housing 18 along a depth axis 70 (best seen in FIGS. 3 and 4) and in a direction away from the mating side 28. Optionally, and as shown in the exemplary embodiment, the depth axis 70 is approximately perpendicular to the central longitudinal axis 58. The central longitudinal axis 58 of the card slot 32 may be referred to herein as a "length axis".

The mating segments 42 of the electrical contacts 40 are arranged in a pair of opposing rows 72 and 74 that extend along the sides 64 and 66, respectively, of the card slot 32. In other words, each of the rows 72 and 74 extends along the length L of the card slot 32 on a respective one of the sides 64 and 66. The mating interfaces 46 of the electrical contacts 40 within the row 72 face generally towards, or oppose, the mating interfaces 46 of the electrical contacts 40 within the opposing row 74, and vice versa. The electrical contacts 40 having mating segments 42 arranged within the row 72 are the second set 53 (shown in FIG. 1) of the contacts 40, while the electrical contacts 40 having mating segments 42 arranged within the row 74 are the first set 51 (shown in FIG. 1) of the contacts 40.

The card slot 32 of the connector 12 includes a power connection segment 76 and a signal connection segment 78. The power connection segment 76 extends from the end 60 of the card slot 32 to an end 80. The signal connection segment 78 extends from the end 62 of the card slot 32 to an end 82.

Optionally, the ends 80 and 82 of the power and signal connection segments 76 and 78, respectively, are separated by a rib 84.

Figure 7:
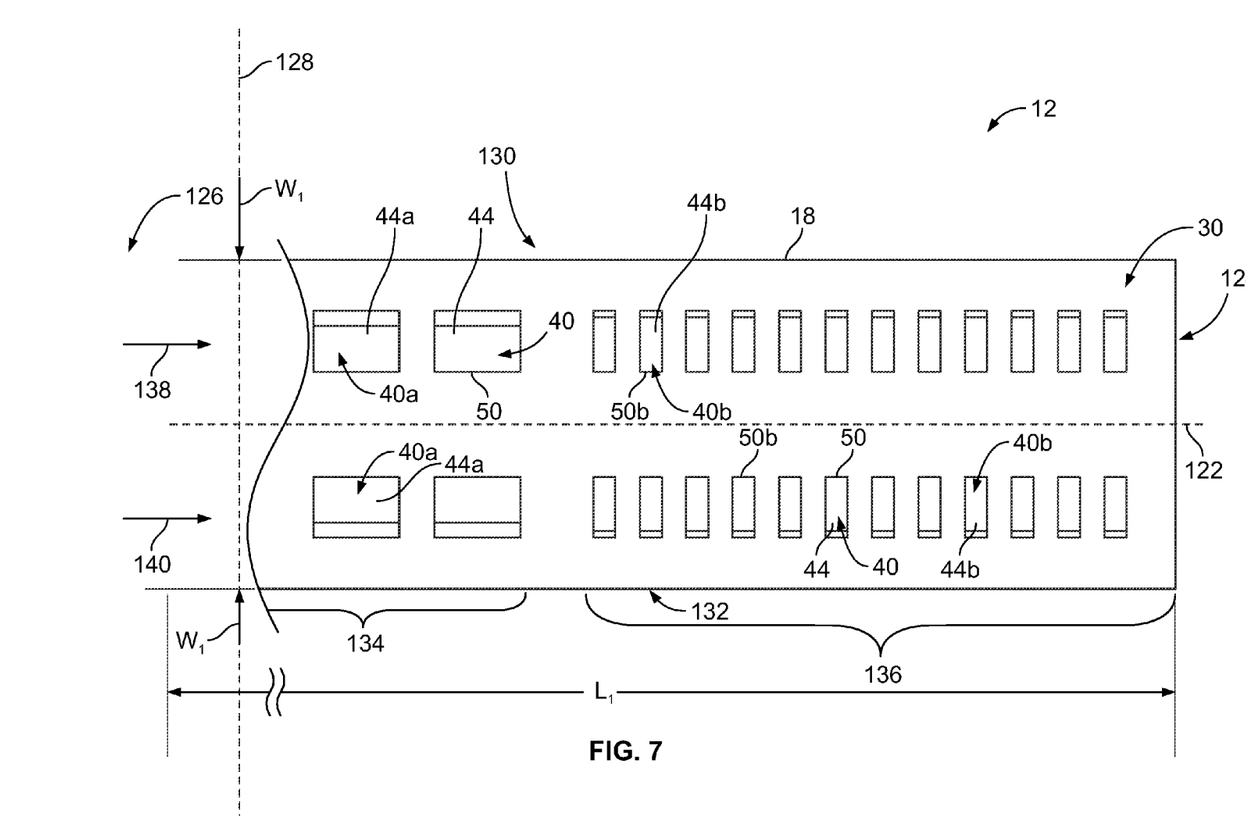
FIG. 7 is a bottom plan view of a portion of the card edge connector shown in FIG. 2.

The electrical contacts 40 include power contacts 40a and signal contacts 40b. The power contacts 40a are configured to carry electrical power and include mating segments 42a and mounting segments 44a (FIG. 7). The signal contacts 40b include mating segments 42b and mounting segments 44b (FIGS. 7, 8, 10, and 11). Each of the rows 72 and 74 of the mating segments 42 of the electrical contacts 40 includes power contacts 40a and signal contacts 40b. The mating segments 42a of the power contacts 40a within the rows 72 and 74 extend within the power connection segment 76 of the card slot 32. The mating segments 42b of the signal contacts 40b within the rows 72 and 74 extend within the signal connection segment 78 of the card slot 32. At least some of the signal contacts 40b are configured to carry electrical data signals. In the exemplary embodiment, all of the signal contacts 40b are configured to carry electrical data signals. Alternatively, the signal contacts 40b may include one or more ground contacts. In some embodiments, some or all of the signal contacts 40b are arranged in differential signal pairs. The connector 12 may include any number of the power contacts 40a and any number of the signal contacts 40b.

Figure 3:
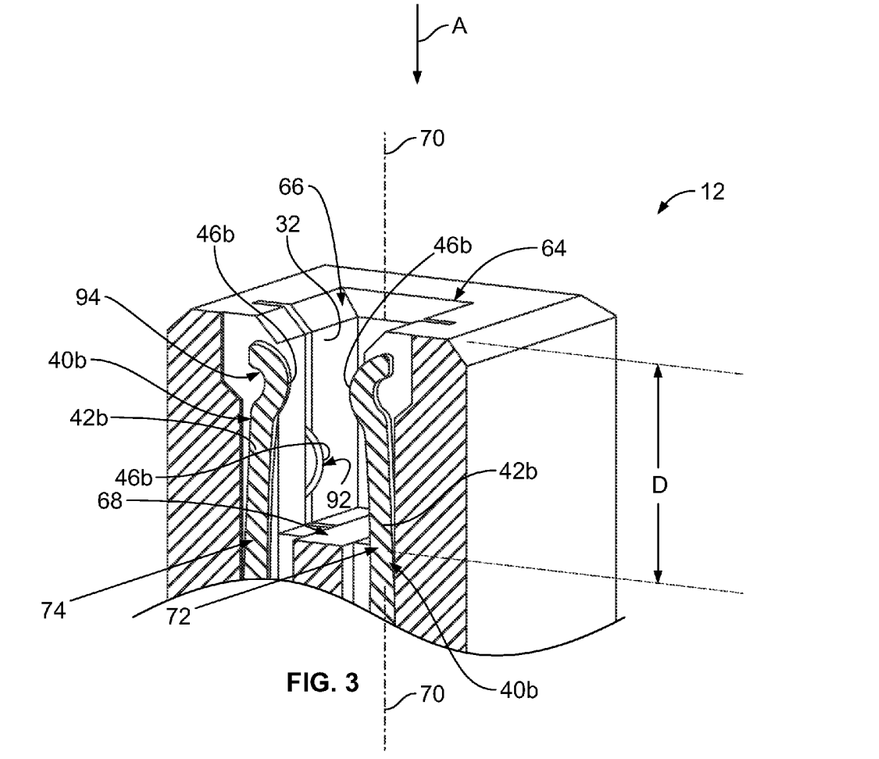
FIG. 3 is a perspective view of a portion of a cross section of the card edge connector shown in FIG. 2 taken along line 3-3 of FIG. 2.

FIG. 3 is a perspective view of a portion of a cross section of the card edge connector 12 taken along line 3-3 of FIG. 2. As can be seen in FIG. 3, the card slot 32 extends the depth D along the depth axis 70 to the bottom side 68. The mating segments 42b of the signal contacts 40b are arranged in the opposing rows 72 and 74 that extend along the sides 64 and 66, respectively, of the card slot 32. Mating interfaces 46b of the mating segments 42b extend into the card slot 32. The mating interfaces 46b of the mating segments 42b that are arranged in the row 72 engage corresponding contact pads 48 (FIGS. 1, 5, and 6) on a side 86 (FIGS. 5 and 6) of the PCB 36 (FIGS. 1, 5, and 6) of the electronic module 14 (FIGS. 1 and 6). The mating interfaces 46b of the mating segments 42b that are arranged in the row 74 engage corresponding contact pads 48 on a side 88 (FIGS. 5 and 6) of the PCB 36 that is opposite the side 86. The mating segments 42b of the signal contacts 40b are springs that have a natural resting position shown in FIG. 3. The mating segments 42b resiliently deflect, against bias to the natural resting position, when engaged by the contact pads 48 of the electronic module 14.

Figure 4:
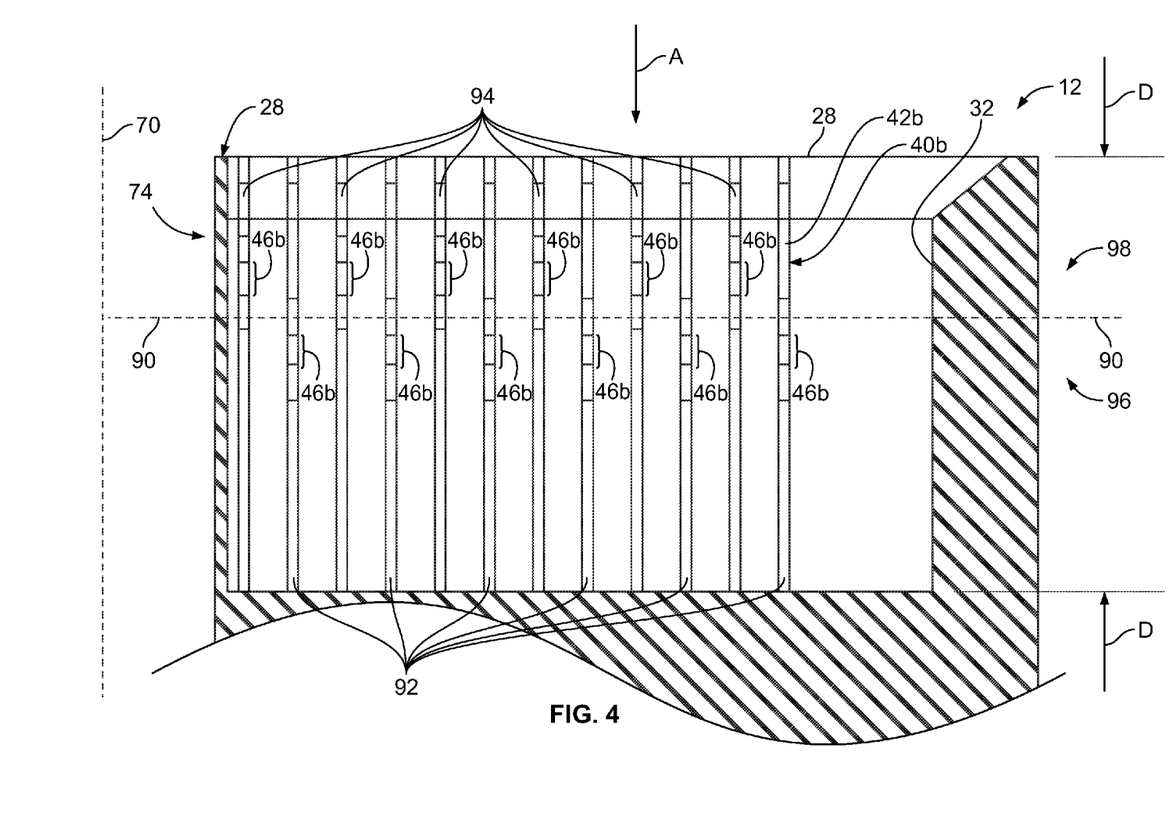
FIG. 4 is a cross-sectional view of a portion the card edge connector shown in FIG. 2 taken along line 4-4 of FIG. 2.

FIG. 4 is a cross-sectional view of a portion the card edge connector 12 taken along line 4-4 of FIG. 2. FIG. 4 illustrates the row 74 of the mating segments 42b of the signal contacts 40b. Referring now to FIGS. 3 and 4, the row 74 extends along a row axis 90 (not shown in FIG. 3). The mating interfaces 46b of adjacent mating segments 42b within the row 74 are offset from each other along the depth D of the card slot 32. In other words, the mating interfaces 46b of adjacent mating segments 42b within the row 74 are offset from each other along the depth axis 70 and along the loading direction A. Accordingly, the mating interfaces 46b of a group 92 of the signal contacts 40b within the row 74 are located a greater distance from the mating side 28 of the housing 18 than the mating interfaces 46b of another group 94 of the signal contacts 40b within the row 74. As best seen in FIG. 4, the mating interfaces 46b of the groups 92 and 94 of the signal contacts 40b within the row 74 are staggered on opposite sides 96 and 98, respectively, of the row axis 90. The mating interfaces 46b of the groups 92 and 94 within the row 74 may be offset from each other along the depth D of the card slot 32 by any amount.

Although not visible in FIG. 3 and not shown in FIG. 4, the mating interfaces 46b of adjacent mating segments 42b within the row 72 are offset from each other along the depth D of the card slot 32 in a substantially similar manner to that of the row 74. More particularly, the mating interfaces 46b of adjacent mating segments 42b within the row 72 are offset from each other along the depth axis 70 and along the loading direction A. Accordingly, the mating interfaces 46b of a group 92 of the signal contacts 40b within the row 72 are located a greater distance from the mating side 28 of the housing 18 than the mating interfaces 46b of another group 94 of the signal contacts 40b within the row 72. The mating interfaces 46b of the groups 92 and 94 within the row 72 may be offset from each other along the depth D of the card slot 32 by any amount. As may be apparent within FIGS. 3 and 6, in the exemplary embodiment, the pattern of the mating interfaces 46b of the groups 92 and 94 within the row 74 is identical to the pattern of the mating interfaces 46b of the groups 92 and 94 within the row 72. But, the groups 92 and 94 within the row 72 may have a different pattern of mating interfaces 46b than the groups 92 and 94 within the row 74. Each of the groups 92 and 94 may be referred to herein as a "plurality of first contacts" and/or a "plurality of second contacts". The sides 96 and 98 may each be referred to herein as a "first side" and/or a "second side".

Figure 5:
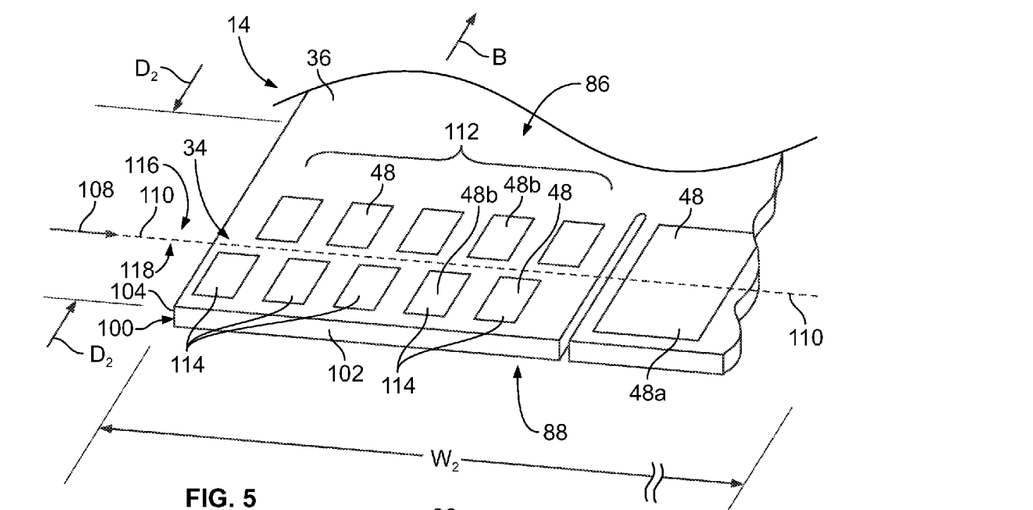
FIG. 5 is a perspective view of a portion of an exemplary embodiment of a card edge of a printed circuit board (PCB) of an electronic module of the assembly shown in FIG. 1.
Figure 6:
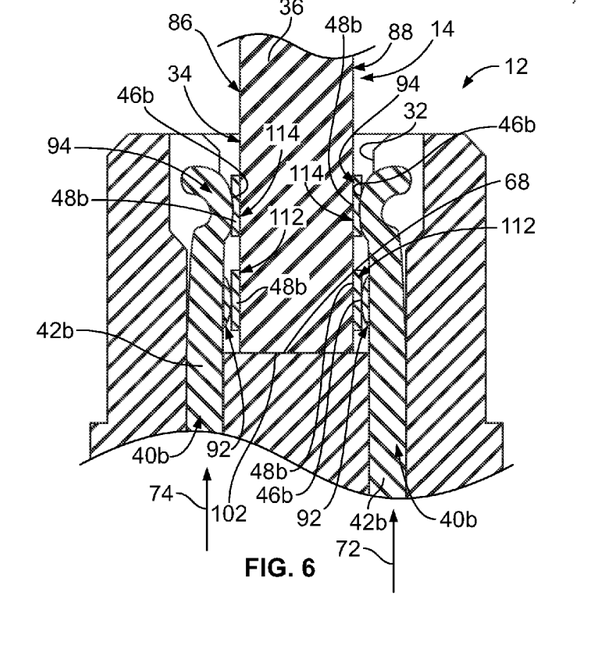
FIG. 6 is a cross-sectional view of the card edge connector shown in FIG. 2 illustrating the electronic module mated therewith.

FIG. 5 is a perspective view of an exemplary embodiment of the card edge 34 of the PCB 36 of the electronic module 14. The PCB 36 includes a substrate 100 that includes the opposite sides 86 and 88. The PCB 36 includes edge surfaces 102 and 104, which intersect the sides 86 and 88 such that the sides 86 and 88 extend from the edge surfaces 102 and 104. The card edge 34 of the PCB 36 is defined by the edge surface 102, portions of the sides 86 and 88 that are proximate the edge surface 102, and a portion of the edge surface 104 that is proximate the edge surface 102. The card edge 34 extends a width $W_2$. As can be seen in FIG. 5, the edge surface 102 extends along the width $W_2$ of the card edge 34. The card edge 34 extends a depth $D_2$ in a direction generally away from the edge surface 102. The sides 86 and 88 may each be referred to herein as a "component surface".

As described above, the PCB 36 includes contact pads 48 arranged on each of the sides 86 and 88 along the card edge 34. The contact pads 48 include power contact pads 48a and signal contact pads 48b. The power contact pads 48a are positioned along the card edge 34 to mate with the power contacts 40a (FIGS. 2 and 7) of the connector 12 (FIGS. 1-4, 6-8, 10, and 11). The signal contact pads 48b are positioned along the card edge 34 to mate with the signal contacts 40b (FIGS. 1-4, 6-8, 10, and 11) of the connector 12. In the exemplary embodiment, the signal contact pads 48b are each configured to carry electrical data signals. Alternatively, the signal contact pads 48b may include one or more ground contact pads. Some or all of the signal contact pads 48b are optionally arranged in differential signal pairs. The PCB 36 may include any number of the power contact pads 48a and any number of the signal contact pads 48b. Each of the signal contact pads 48b may be referred to herein as a "first contact pad" and/or a "second contact pad".

Referring now to the side 86, which is illustrated in FIG. 5, the signal contact pads 48b are arranged in a row 108 that extends along the card edge 34. The row 108 extends along a row axis 110. Adjacent signal contact pads 48b within the row 108 are offset from each other in a direction generally away from the edge surface 102, as indicated by the arrow B in FIG. 5. In other words, adjacent signal contact pads 48b within the row 108 are offset from each other along the depth $D_2$ of the card edge 34. Accordingly, a group 112 of the signal contact pads 48b within the row 108 are located a greater distance from the edge surface 102 than another group 114 of the signal contact pads 48b within the row 108. The groups 112 and 114 of the signal contact pads 48*b* within the row 108 are staggered on opposite sides 116 and 118, respectively, of the row axis 110. The signal contact pads 48*b* of the groups 112 and 114 within the row 108 may be offset from each other by any amount.

Although not visible in FIG. 5, the signal contact pads 48*b* on the side 88 are also arranged in a row 108 that extends along the card edge 34. Adjacent signal contact pads 48*b* within the row 108 on the side 88 are offset from each other in a direction generally away from the edge surface 102 in a substantially similar manner to that of the signal contact pads 48*b* on the side 86. More particularly, adjacent signal contact pads 48*b* within the row 108 and on the side 88 are offset from each other along the depth $D_2$ of the card edge 34. A group 112 of the signal contact pads 48*b* on the side 88 is located a greater distance from the edge surface 102 than another group 114 of the signal contact pads 48*b* on the side 88. The groups 112 and 114 of the signal contact pads 48*b* on the side 88 may be offset from each other by any amount. In the exemplary embodiment, the pattern of the groups 112 and 114 on the side 86 is identical to the pattern of the groups 112 and 114 on the side 88. But, the groups 112 and 114 on the side 86 may have a different pattern than the groups 112 and 114 on the side 88.

FIG. 6 is a cross-sectional view of the card edge connector 12 illustrating the electronic module 14 mated therewith. When the electronic module 14 is mated with the connector 12, the card edge 34 of the PCB 36 of the electronic module 14 is received within the card slot 32 of the connector 12. The mating interfaces 46*b* of the mating segments 42*b* of the signal contacts 40*b* that are arranged in the row 74 are engaged with, and thereby electrically connected to, the corresponding signal contact pads 48*b* on the side 86 of the PCB 36 of the electronic module 14. More specifically, the groups 92 and 94 of the mating interfaces 46*b* within the row 74 are engaged with, and thereby electrically connected to, the respective groups 112 and 114 of the signal contact pads 48*b* on the side 86. The mating interfaces 46*b* of the mating segments 42*b* of the signal contacts 40*b* that are arranged in the row 72 are similarly engaged with, and thereby electrically connected to, the corresponding signal contact pads 48*b* on the side 88 of the PCB 36. The groups 92 and 94 of the mating interfaces 46*b* within the row 72 are engaged with, and thereby electrically connected to, the respective groups 112 and 114 of the signal contact pads 48*b* on the side 88. Optionally, the edge surface 102 of the PCB 36 abuts the bottom side 68 of the card slot 32 when the electronic module 14 is mated with the connector 12.

FIG. 7 is a bottom plan view of a portion of the card edge connector 12 illustrating the mounting side 30. The mounting side 30 extends a length $L_1$ along a central longitudinal axis 122 from an end 124 to an opposite end 126. The mounting side 30 extends a width $W_1$ along a latitudinal axis 128 from a side 130 to an opposite side 132. Optionally, and as shown in the exemplary embodiment, the axes 122 and 128 are approximately perpendicular to each other. The mounting side 30 of the connector 12 includes a power connection segment 134 and a signal connection segment 136. The central longitudinal axis 122 of the mounting side 30 may be referred to herein as a "length axis". The latitudinal axis 128 of the mounting side 30 may be referred to herein as a "width axis".

The mounting segments 44 of the electrical contacts 40 are arranged in a pair of opposing rows 138 and 140 along the mounting side 30 of the housing 18. The mounting interfaces 50 of the electrical contacts 40 within the row 138 face generally towards, or oppose, the mounting interfaces 50 of the electrical contacts 40 within the row 140, and vice versa. The electrical contacts 40 having mounting segments 44 arranged within the row 138 are the second set 53 (shown in FIG. 1) of the contacts 40, while the electrical contacts 40 having mounting segments 44 arranged within the row 140 are the first set 51 (shown in FIG. 1) of the contacts 40.

As can be seen in FIG. 7, each of the rows 138 and 140 of the mounting segments 44 of the electrical contacts 40 includes power contacts 40*a* and signal contacts 40*b*. The mounting segments 44*a* of the power contacts 40*a* within the rows 138 and 140 extend within the power connection segment 134. The mounting segments 44*b* of the signal contacts 40*b* within the rows 138 and 140 extend within the signal connection segment 136. Mounting interfaces 50*b* of the signal contacts 40*b* that are arranged in the row 138 are configured to be electrically connected to corresponding signal contact pads 52*b* (FIGS. 9-11) on the side 56 of the PCB 16 (FIGS. 1 and 9-11). Mounting interfaces 50*b* of the signal contacts 40*b* arranged in the row 140 are configured to be electrically connected to corresponding signal contact pads 52*b* on the side 54 of the PCB 16.

Figure 8:
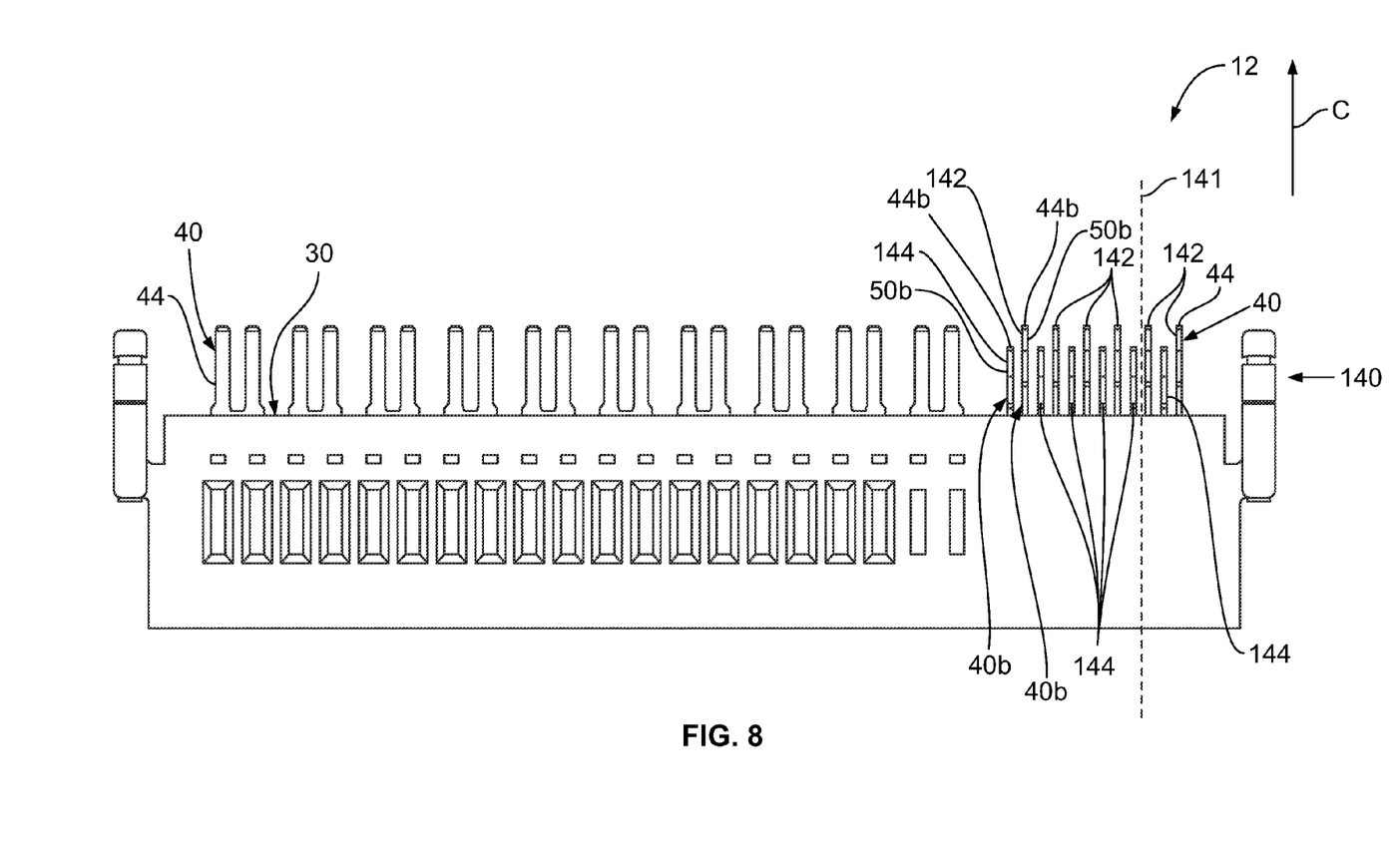
FIG. 8 is a side elevational view of the card edge connector shown in FIG. 2.

FIG. 8 is a side elevational view of the card edge connector 12 illustrating the row 140 of the mounting segments 44 of the electrical contacts 40. The mounting interfaces 50*b* of adjacent mounting segments 44*b* of the signal contacts 40*b* within the row 140 are offset from each other. More particularly, the mounting segments 44*b* of the signal contacts 40*b* extend outwardly from the mounting side 30 along a segment axis 141. The mounting interfaces 50*b* of adjacent mounting segments 44*b* within the row 140 are offset from each other along the segment axis 141. Accordingly, the mounting interfaces 50*b* of a group 142 of the signal contacts 40*b* within the row 140 are offset from the mounting interfaces 50*b* of another group 144 of the signal contacts 40*b* within the row 140 in a direction generally away from the mounting side 30 of the housing 18, as indicated by the arrow C in FIG. 8. In other words, the mounting interfaces 50*b* of the group 142 are located a greater distance from the mounting side 30 of the housing 18 than the mounting interfaces 50*b* of the group 144 of the signal contacts 40*b* within the row 140. Optionally, the mounting segments 44*b* of the group 142 within the row 140 extend a greater length from the mounting side 30 of the housing 18 than the mounting segments 44*b* of the group 144 within the row 140. The mounting interfaces 50*b* of the groups 142 and 144 within the row 140 may be offset from each other by any amount. The segment axis 141 optionally extends approximately perpendicular to the axis 122 and/or the axis 128 (FIG. 7).

Although not visible in FIG. 8, the mounting interfaces 50*b* of adjacent mounting segments 44*b* within the row 138 are offset from each other in a substantially similar manner to that of the row 140. More particularly, the mounting interfaces 50*b* of adjacent mounting segments 44*b* within the row 138 are offset from each other along the segment axis 141, such that the mounting interfaces 50*b* of a group 142 of the signal contacts 40*b* within the row 138 are offset from the mounting interfaces 50*b* of another group 144 of the signal contacts 40*b* within the row 138 in a direction generally away from the mounting side 30 of the housing 18. In other words, the mounting interfaces 50*b* of the group 142 within the row 138 are located a greater distance from the mounting side 30 of the housing 18 than the mounting interfaces 50*b* of the group 144 within the row 138. In the exemplary embodiment, the pattern of the mounting interfaces 50*b* of the groups 142 and 144 within the row 140 is identical to the pattern of the mounting interfaces 50*b* of the groups 142 and 144 within the row 138. Alternatively, the groups 142 and 144 within the row 138 may have a different pattern of mounting interfaces 50b than the groups 142 and 144 within the row 140.

Figure 9:
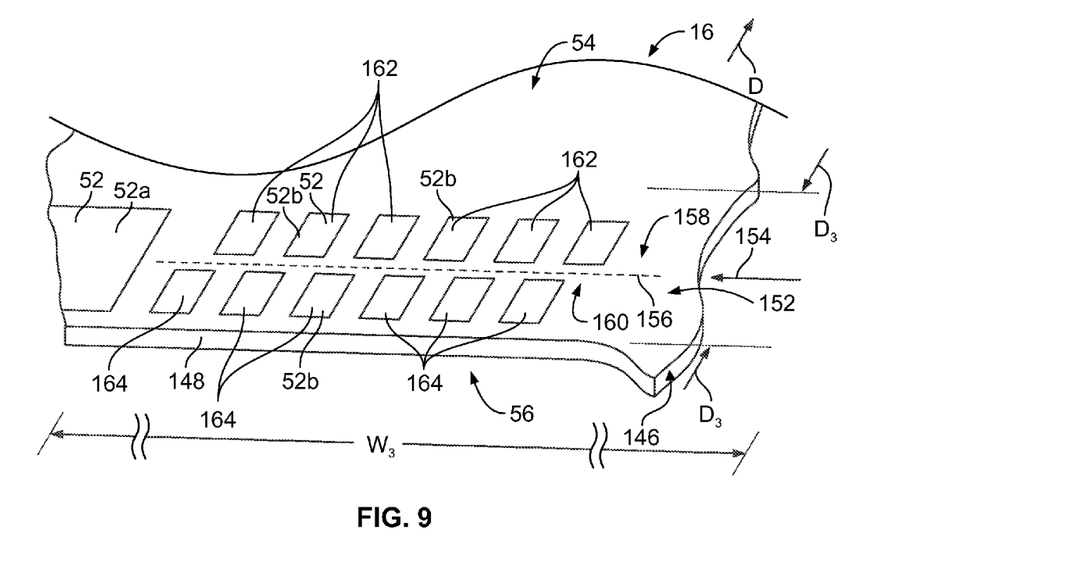
FIG. 9 is a perspective view of a portion of a PCB of the assembly shown in FIG. 1.

FIG. 9 is a perspective view of a portion of the PCB 16. The PCB 16 includes a substrate 146 that includes the opposite first and second sides 54 and 56. The PCB 16 includes an edge surface 148 and 150 (edge surface 150 is shown in FIG. 1), which intersect the sides 54 and 56 such that the sides 54 and 56 extend from the edge surfaces 148 and 150. A mounting edge 152. to which the connector 12 (FIGS. 1-4, 6-8, 10, and 11) mounts, is defined by the edge surface 148, portions of the sides 54 and 56 that are proximate the edge surface 148, and a portion of the edge surface 150 that is proximate the edge surface 148. The mounting edge 152 extends a width $W_3$. The edge surface 148 extends along the width $W_3$ of the mounting edge 152. The mounting edge 152 extends a depth $D_3$ in a direction generally away from the edge surface 148. The sides 54 and 56 may each be referred to herein as a "component surface".

As described above, the PCB 16 includes contact pads 52 arranged on each of the sides 54 and 56 along the mounting edge 152. The contact pads 52 include power contact pads 52a and signal contact pads 52b. The power contact pads 52a are positioned along the mounting edge 152 to electrically connect to the power contacts 40a (FIGS. 2 and 7) of the connector 12. The signal contact pads 52b are positioned along the mounting edge 152 to electrically connect to the signal contacts 40b (FIGS. 2-4, 6-8, 10, and 11) of the connector 12. In the exemplary embodiment, the signal contact pads 52b are each configured to carry electrical data signals. Alternatively, the signal contact pads 52b may include one or more ground contact pads. Optionally, some or all of the signal contact pads 52b are arranged in differential signal pairs. The PCB 16 may include any number of the power contact pads 52a and any number of the signal contact pads 52b. Each of the signal contact pads 52b may be referred to herein as a "first contact pad" and/or a "second contact pad".

Referring now to the side 54 of the PCB 16, which is illustrated in FIG. 9, the signal contact pads 52b are arranged in a row 154 that extends along the mounting edge 152. The row 154 extends along a row axis 156. Adjacent signal contact pads 52b within the row 154 are offset from each other in a direction generally away from the edge surface 148, as indicated by the arrow 1) in FIG. 9. In other words, adjacent signal contact pads 52b within the row 154 are offset from each other along the depth $D_3$ of the mounting edge 152. Accordingly, a group 162 of the signal contact pads 52b within the row 154 are located a greater distance from the edge surface 148 than another group 164 of the signal contact pads 52b within the row 154. The groups 162 and 164 of the signal contact pads 52b within the row 154 are staggered on opposite sides 158 and 160, respectively, of the row axis 156. The signal contact pads 52b of the groups 162 and 164 within the row 154 may be offset from each other by any amount.

Although not visible in FIG. 9, the signal contact pads 52b on the side 56 are also arranged in a row 154 that extends along the mounting edge 152. Adjacent signal contact pads 52b within the row 154 on the side 56 are offset from each other in a direction generally away from the edge surface 148 in a substantially similar manner to that of the signal contact pads 52b on the side 54. In other words, adjacent signal contact pads 52b within the row 154 and on the side 56 are offset from each other along the depth $D_3$ of the mounting edge 152. A group 162 of the signal contact pads 52b on the side 56 is located a greater distance from the edge surface 148 than another group 164 of the signal contact pads 52b on the side 56. The groups 162 and 164 of the signal contact pads 52b on the side 56 may be offset from each other by any amount. In the exemplary embodiment, the pattern of the groups 162 and 164 on the side 54 is identical to the pattern of the groups 162 and 164 on the side 56. But, in some alternative embodiments, the groups 162 and 164 on the side 56 may have a different pattern than the groups 162 and 164 on the side 54.

Figure 10:
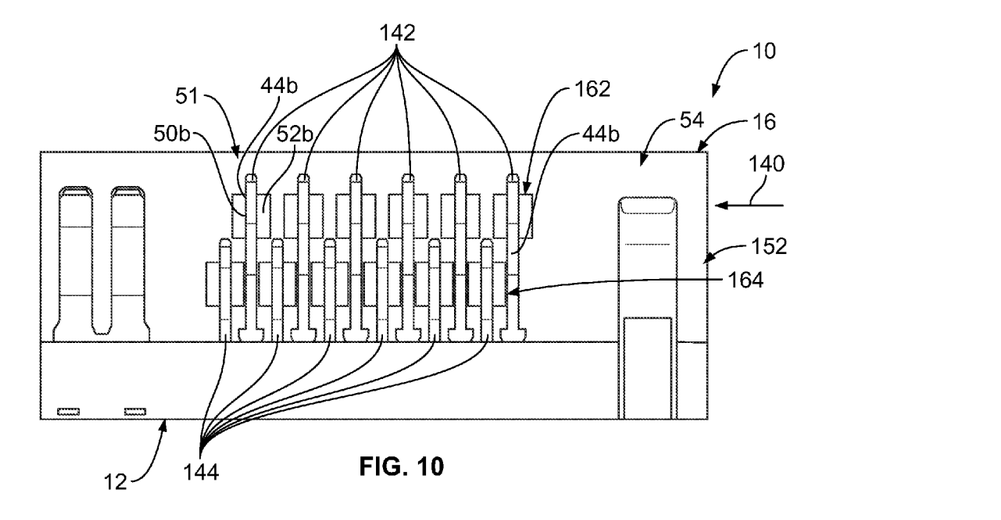
FIG. 10 is a side elevational view of a portion of the assembly shown in FIG. 1 illustrating the connector 12 shown in FIG. 2 mounted to the PCB shown in FIG. 9.
Figure 11:
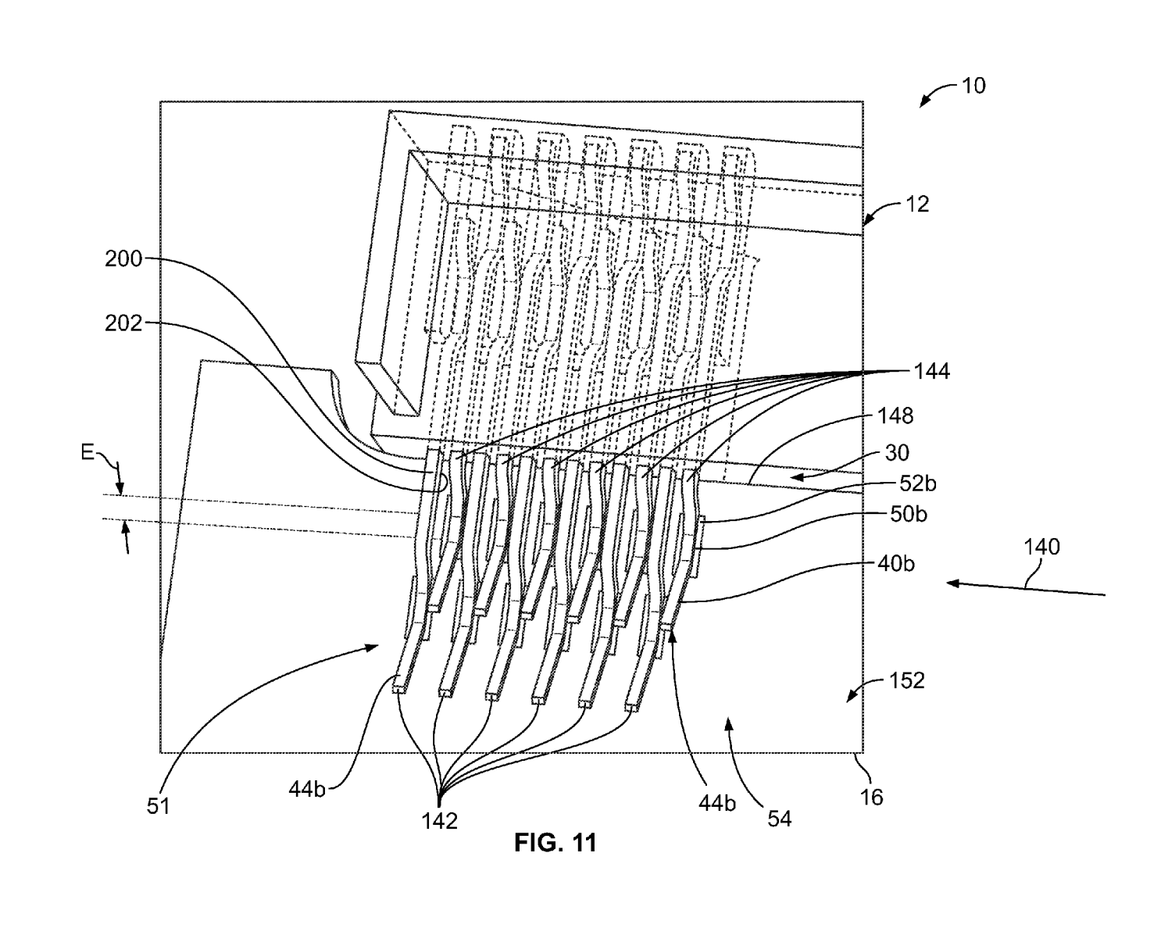
FIG. 11 is a perspective view of a portion of the assembly shown in FIG. 1 illustrating the connector 12 shown in FIG. 2 mounted to the PCB shown in FIG. 9.

FIGS. 10 and 11 are side elevational and perspective views, respectively, of a portion of the assembly 10 illustrating the connector 12 mounted to the PCB 16. When the connector 12 is mounted to the PCB 16, the mounting edge 152 of the PCB 16 is received between the mounting segments 44b of the set 51 and the set 53 (FIG. 1) of the electrical contacts 40. Referring now to the side 54 of the PCB 16, which is illustrated in FIGS. 10 and 11, the mounting interfaces 50b of the mounting segments 44b within the row 140 are electrically connected to the corresponding signal contact pads 52b on the side 54 of the PCB 16. More specifically, the groups 142 and 144 of the mounting interfaces 50b within the row 140 are electrically connected to the respective groups 162 and 164 of the signal contact pads 52b on the side 54 of the PCB 16.

The mounting interfaces 50b of the mounting segments 44b of the signal contacts 40b that are arranged in the row 138 are similarly electrically connected to the corresponding signal contact pads 52b on the side 56 of the PCB 16. More particularly, the groups 142 and 144 of the mounting interfaces 50b within the row 138 are electrically connected to the respective groups 162 and 164 of the signal contact pads 52b on the side 56 of the PCB 16. The mounting interfaces 50b of the signal contacts 40b are optionally electrically connected to the signal contact pads 52b of the PCB 16 using solder. Optionally, the edge surface 148 of the PCB 16 abuts the mounting side 30 of the housing 18 when the connector 12 is mounted to the PCB 16.

Optionally, and as can be seen in FIG. 11, adjacent signal contacts 40b are held by the housing 18 such that lengths of adjacent signal contacts 40b are shifted relative to each other along the central axis 26.

Referring to FIGS. 9, 10, and 11, the offset of adjacent mounting interfaces 50b of the signal contacts 40b enables the contact pads 52b to be arranged closer together along the width $W_3$ of the mounting edge 152. The contact pads 52b optionally overlap along the width $W_3$ of the mounting edge 152. The closer arrangement of the contact pads 52b along the width $W_3$ of the mounting edge 152 may enable a higher density of the signal contacts 40b and contact pads 52b. Because adjacent contact pads 52b are offset along the depth $D_3$ of the mounting edge 152, adjacent contact pads 52b and adjacent signal contacts 40b will not experience solder bridging therebetween. For example, when the mounting interface 50b of a signal contact 40b is positioned on the corresponding contact pad 52b, solder on the pad 52b may be pushed outwardly along the width $W_3$ of the mounting edge 152. Because adjacent contact pads 52b are offset along the depth $D_3$ of the mounting edge 152, solder on a contact pad 52 that is pushed outwardly via engagement with the corresponding signal contact 40b will not engage the adjacent signal contacts 40b nor the adjacent contact pads 52b.

Moreover, and referring now to FIG. 11, the mounting segments 44b of the signal contacts 40b include legs 200 that are elevated, or extend out-of-plane, relative to the mounting interfaces 50b of adjacent signal contacts 40b. More specifically, an inner surface 202 of each leg 200 that faces the PCB 16 is spaced apart from the contact pads 52b by an elevation E of any amount. Accordingly, solder pushed outwardly from a contact pad 52b via engagement with the corresponding signal contact 40b will not engage the legs 200 of adjacent signal contacts 40b.

The offset of adjacent contact pads 52b along the depth $D_3$ of the mounting edge 152 may cause adjacent contact pads 52b to experience the same, less, or no, electrical interference. More specifically, the offset of adjacent contact pads 52b may enable a higher density of the signal contacts 40b and contact pads 52b for a given electrical interference, may enable less or no electrical interference for a given density, and/or may enable a higher density and less or no electrical interference.

Referring to FIGS. 4 and 5, the offset of adjacent mating interfaces 46b of the signal contacts 40b enables the contact pads 48b to be arranged closer together along the width $W_2$ of the card edge 34, which may enable a higher density of the signal contacts 40b and contact pads 48b. The contact pads 48b optionally overlap along the width $W_2$ of the card edge 34. However, because adjacent contact pads 48b are offset along the depth $D_2$ of the card edge 34, adjacent contact pads 48b will experience the same, less, or no, electrical interference therebetween for a given density. In other words, the offset of adjacent contact pads 48b may enable a higher density of the signal contacts 40b and contact pads 48b for a given electrical interference, may enable less or no electrical interference for a given density, and/or may enable a combination of a higher density and less or no electrical interference.

The embodiments described and/or illustrated herein may provide an electrical connector that has a greater number and/or size of power contacts for a given connector size. The embodiments described and/or illustrated herein may provide an electrical connector that has a greater number and/or size of power contacts for a given connector size and for a connector having a given number and/or size of signal contacts. The embodiments described and/or illustrated herein may provide an electrical connector that has a greater number and/or size of signal contacts for a given connector size and for a connector having a given number and/or size of power contacts.

It is to be understood that the above description and the figures are intended to be illustrative, and not restrictive. For example, the above-described and/or illustrated embodiments (and/or aspects thereof) may be used in combination with each other. In addition, many modifications may be made to adapt a particular situation or material to the teachings of the subject matter described and/or illustrated herein without departing from its scope. Dimensions, types of materials, orientations of the various components (including the terms "upper", "lower", "vertical", and "lateral"), and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description and the figures. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second." and "third." etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A card edge connector for mounting to a printed circuit board (PCB), the card edge connector comprising:
a housing comprising a mating side, a mounting side, and a card slot that extends into the mating side, the connector being configured to be mounted to the PCB along the mounting side of the housing, the card slot being configured to receive an electronic module therein; and
first and second contacts held by the housing, the first and second contacts comprising mating segments that extend into the card slot for mating with the electronic module, the first and second contacts comprising mounting segments having mounting interfaces, the mounting segments of the first and second contacts being configured to be electrically connected to corresponding contact pads on the PCB at the mounting interfaces, wherein the mounting interface of the first contact is offset from the mounting interface of the second contact in a direction generally away from the mounting side of the housing.

2. The card edge connector of claim 1, wherein the mounting interface of the first contact is located a greater distance from the mounting side of the housing than the mounting interface of the second contact.

3. The card edge connector of claim 1, wherein the mounting side extends a length along a length axis and a width along a width axis that is approximately perpendicular to the length axis, the mounting segments of the first and second contacts extending outwardly from the mounting side of the housing along a segment axis that is approximately perpendicular to the length and width axes, the mounting interface of the first contact being offset along the segment axis from the mounting interface of the second contact.

4. The card edge connector of claim 1, wherein the housing extends from the mating side to the mounting side along a housing axis, the first and second contacts being held by the housing such that lengths of the first and second contacts are shifted relative to each other along the housing axis.

5. The card edge connector of claim 1, further comprising the PCB, wherein the PCB includes an edge surface and a component surface that extends from the edge surface, the PCB comprising first and second contact pads that extend along the component surface, the mounting interfaces of the first and second contacts being electrically connected to the first and second contact pads, respectively, wherein the first contact pad is offset from the second contact pad along the component surface of the card edge in a direction generally away from the edge surface.

6. The card edge connector of claim 1, wherein the mounting segment of the first contact extends a greater length from the mounting side of the housing than the mounting segment of the second contact.

7. The card edge connector of claim 1, wherein the mounting side comprises a power connection segment and a signal connection segment, the card edge connector comprising a power contact held by the housing such that the power contact extends along the power connection segment, the mounting segments of the first and second contacts extending along the signal connection segment.

8. The card edge connector of claim 1, wherein the first and second contacts comprise signal contacts.

9. The card edge connector of claim 1, wherein the card edge connector is configured to be straddle-mounted to the PCB.

10. The card edge connector of claim 1, wherein the card slot extends a depth into the housing, the mating segments of the first and second contacts comprising mating interfaces that are offset relative to each other along the depth of the card slot.

11. The card edge connector of claim 1, wherein the mounting side of the housing extends a length along a central longitudinal axis, the mounting segments of the first and second contacts being arranged within a row that extends approximately parallel to the central longitudinal axis, wherein the mounting interfaces of the first and second contacts are not aligned along the central longitudinal axis with the mounting interface of any other contact that includes a mating segment arranged within the row.

12. A card edge connector assembly comprising:
a printed circuit board (PCB) having a mounting edge that includes an edge surface and a component surface that extends from the edge surface, the PCB comprising first and second contact pads that extend on the component surface along the mounting edge, the first contact pad being offset from the second contact pad along the component surface of the card edge in a direction generally away from the edge surface; and
a card edge connector comprising:
a housing comprising a mating side, a mounting side, and a card slot that extends into the mating side, the connector being mounted to the mounting edge of the PCB along the mounting side of the housing, the card slot being configured to receive an electronic module therein; and
first and second contacts held by the housing, the first and second contacts comprising mating segments that extend into the card slot for mating with the electronic module, the first and second contacts comprising mounting segments having mounting interfaces, the mounting segments of the first and second contacts being electrically connected to the first and second contact pads, respectively, of the PCB at the mounting interfaces, wherein the mounting interface of the first contact is offset from the mounting interface of the second contact in a direction generally away from the mounting side of the housing.

13. The assembly of claim 12, wherein the mounting edge of the PCB extends a width, the edge surface extending along the width of the mounting edge, the first and second contact pads overlapping along the width of the mounting edge.

14. The assembly of claim 12, wherein the first and second contacts are arranged in a row along the mounting side of the housing, the first and second contacts extending adjacent each other within the row, the mounting segment of the first contact comprising a leg that is elevated relative to the mounting interface of the second contact.

15. The assembly of claim 12, wherein the mounting side of the housing comprises a power connection segment and a signal connection segment, the card edge connector comprising a power contact held by the housing such that the power contact extends along the power connection segment, the first and second contacts being signal contacts, the mounting segments of the first and second contacts extending along the signal connection segment.

16. The assembly of claim 12, wherein the card slot extends a depth into the housing, the mating segments of the first and second contacts comprising mating interfaces that are offset relative to each other along the depth of the card slot.

17. The assembly of claim 12, wherein the mounting side of the housing extends a length along a central longitudinal axis, the mounting segments of the first and second contacts being arranged within a row that extends approximately parallel to the central longitudinal axis, wherein the mounting interfaces of the first and second contacts are not aligned along the central longitudinal axis with the mounting interface of any other contact includes a mating segment arranged within the row.

18. A card edge connector for mating with a printed circuit board (PCB) having a card edge, the card edge connector comprising:
a housing comprising a card slot that is configured to receive the card edge of the PCB therein, the card slot extending a depth into the housing, the card slot extending a length along a central longitudinal axis, the card slot comprising a power connection segment and a signal connection segment;
signal contacts held by the housing such that the signal contacts extend within the signal connection segment of the card slot, the signal contacts comprising mating segments that are arranged within a row that extends along a side of the card slot, the mating segments comprising mating interfaces, the signal contacts being configured to mate with the PCB at the mating interfaces, wherein the mating interfaces of adjacent mating segments within the row are offset relative to each other along the depth of the card slot, and wherein no mating interfaces within the row are aligned with each other along the central longitudinal axis; and
a power contact held by the housing such that the power contact extends within the power connection segment of the card slot, the power contact being configured to carry electrical power.

19. The card edge connector of claim 18, further comprising the PCB, wherein the card edge of the PCB includes an edge surface and a component surface that extends from the edge surface, the PCB comprising contact pads that extend along the component surface, the mating interfaces of the signal contacts being mated with corresponding contact pads.

20. The card edge connector of claim 18, wherein the PCB is a first PCB and the row of the mating segments is a mating row, the housing including a mating side and a mounting side, the card slot extending into the mating side of the housing, the card edge connector being configured to be mounted to a second PCB along the mounting side of the housing, the signal contacts comprising mounting segments that are arranged within a mounting row that extends along the mounting side of the housing, the mounting segments extending outwardly from the mounting side of the housing along a segment axis, the mounting segments having mounting interfaces, wherein the mounting interfaces of adjacent signal contacts within the mounting row are offset relative to each other along the segment axis.

* * * * *